United States Patent [19]

Sasaki

[11] Patent Number: 4,504,798
[45] Date of Patent: Mar. 12, 1985

[54] TRANSISTOR CIRCUIT INCLUDING BIASSING CIRCUIT

[75] Inventor: Yutaka Sasaki, Tokyo, Japan

[73] Assignee: Nippon Electric Co., Ltd., Tokyo, Japan

[21] Appl. No.: 443,331

[22] Filed: Nov. 22, 1982

[30] Foreign Application Priority Data

Nov. 24, 1981 [JP] Japan .................. 56-189008

[51] Int. Cl.³ .............................................. H03F 3/04
[52] U.S. Cl. .................................... 330/296; 330/289
[58] Field of Search ................ 330/289, 296, 311, 307

[56] References Cited

U.S. PATENT DOCUMENTS 3,320,365 5/1967 Auernheimer ............... 330/296
3,560,995 2/1971 Zielinski ....................... 330/289

OTHER PUBLICATIONS

Motorola, Inc. Communications Division, "Handie-Com" FM Two-Way Portable Radio, MH70 Series, 150.8–174 MHz, 2 Watts RF Service Manual.

Primary Examiner—James B. Mullins
Assistant Examiner—G. Wan
Attorney, Agent, or Firm—Laff, Whitesel, Conte & Saret

[57] ABSTRACT

An amplifier or oscillator transistor circuit with low power consumption has a first transistor for amplification or oscillation and a biassing circuit for supplying a D.C. biassing voltage to the base of the first transistor. The biassing circuit comprises a voltage dividing resistor having an output terminal for providing a divided D.C. voltage. A second transistor has an emitter follower circuit with a base which is connected to the output terminal. Its emitter is coupled to the base of the first transistor to provide the D.C. biassing voltage. Furthermore, the first transistor means has an inverse conductive junction accompanied to the junction of the second transistor.

7 Claims, 3 Drawing Figures

TRANSISTOR CIRCUIT INCLUDING BIASSING CIRCUIT

BACKGROUND OF THE INVENTION

The present invention relates to a transistor circuit for amplification or oscillation, and more particularly to a biassing circuit for the supply of a biassing voltage to the base of a transistor circuit.

A well known biassing circuit of this kind comprises a pair of resistors for dividing a power source voltage to supply the divided voltage to the base of the transistor circuit, as disclosed in the U.S. Pat. No. 3,974,452 issued on Aug. 10, 1976 (with particular reference to Oscillator 18 in FIG. 2b thereof) or in Motorola's Service Manual published in 1972 (more particularly pp. 8-10). The voltage dividing resistors requires high resistances to reduce the power consumption, with the consequence that the D.C. impedance of the biassing circuit is comparatively high and the voltage $V_{BE}$ between the base and the emitter of the transistor circuit declines with a rise in the input signal level, in the base.

Therefore, the biassing point of the transistor shifts from a linear region to a non-linear region, thereby varying the impedance between the base and the emitter. This results in a deterioration in the impedance matching characteristic of the transistor circuit and eventually in an abnormal oscillation or the like. This phenomenon can be avoided by reducing the resistances of the voltage dividing resistors however, the power consumption of the voltage divider would then increase.

Further, the variation in the collector current of the transistor circuit, owing to temperature change, can also be suppressed by reducing the resistances of the voltage dividing resistors, but here again there would be the disadvantage of a greater power consumption.

SUMMARY OF THE INVENTION

An object of the present invention, therefore, is to provide a transistor circuit for amplification or oscillation, the transistor circuit being capable of reducing power consumption in voltage dividing resistors which are used for biasing and of suppressing the variation of the amplification or oscillation characteristic owing to temperature change, all being accomplished without causing a deteriorating performance.

In one aspect of the present invention, a transistor circuit has a first transistor means for amplification or oscillation and a biassing means for supplying a D.C. biassing voltage to the base of the first transistor means. The biassing means comprises a voltage dividing resistor means having an output terminal for providing a divided D.C. voltage, and a second transistor means constituting an emitter follower circuit means. The base of the second transistor is connected to the output terminal and its emitter is coupled to the base of the first transistor means, to provide the D.C. biassing voltage. Furthermore, the first transistor means has an inverse conductive junction structure, as compared to the junction of the second transistor means.

BRIEF DESCRIPTION OF THE DRAWING

Other advantages and features of the invention will be more apparent from the detailed description hereunder taken in conjunction with the accompanying drawings, wherein.

PREFERRED EMBODIMENTS OF THE INVENTION

Figure 1:
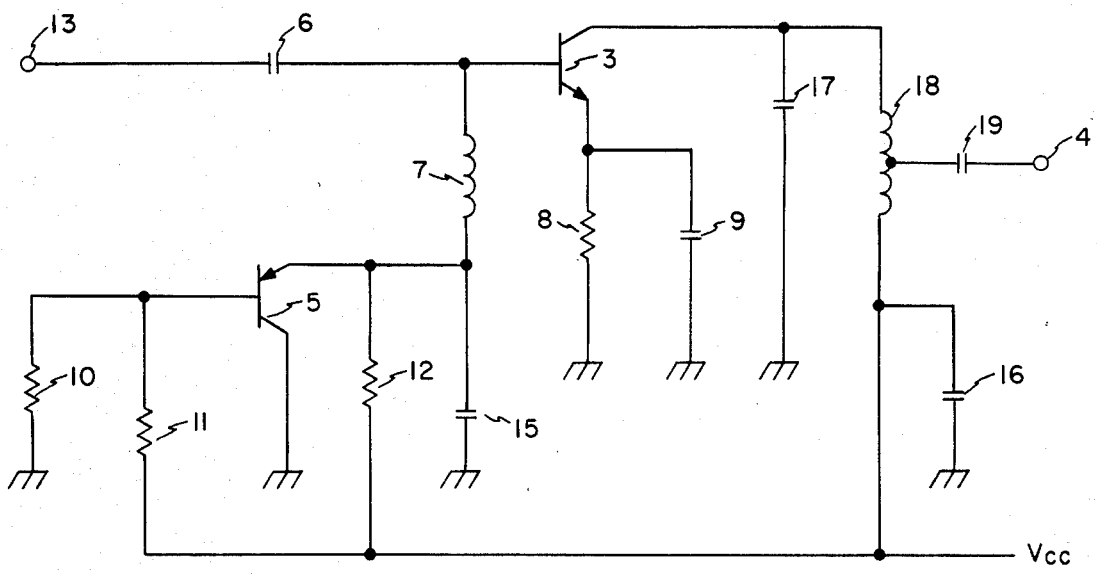
FIG. 1 illustrates a first embodiment of the invention, which is a transistor amplifier circuit.

A transistor circuit shown in FIG. 1 is an emitter-grounded A.C. amplifier circuit comprising an NPN transistor 3 to which a base biassing voltage is supplied through a choke coil 7, from an emitter follower circuit including a PNP transistor 5. An A.C. input signal is supplied to the base of the NPN transistor 3 through a coupling capacitor 6. To the emitter of the transistor 3 are connected a resistor 8 and a bypass capacitor 9. The collector of the PNP transistor 5 is grounded. Voltage dividing resistors 10 and 11 are connected to its base, and a D.C. voltage is supplied through a resistor 12 to its emitter, which is also connected to the choke coil 7.

In FIG. 1, reference numeral 13 identifies an A.C. signal input terminal; 14, an output terminal; 15 and 16, bypass capacitors; 17, a tuning capacitor; 18, a tuning coil; and 19, a coupling capacitor.

Since the transistor 5 operates as an emitter follower in this circuitry, the emitter-grounding impedance of this transistor 5 apparently corresponds to about $1/h_{fe}$ of its base-grounding impedance, where $h_{fe}$ is the d.c. current gain of the transistor 5. Therefore, the emitter-grounding impedance can be kept extremely low by using a transistor having a high $h_{fe}$ even if the resistance of the voltage dividing resistors 10 and 11 are high. A result is a reduction in the D.C. impedance with respect to ground of the base of the transistor 3, which is D.C. connected to the emitter of the transistor 5. Accordingly, even if a relatively high level input signal comes in through the input terminal 13, the variation in the voltage $V_{BE}$ between the base and the emitter of the transistor 3 can be kept small. Thus, the transistor circuit is hardly susceptible to either a deterioration in its A.C. amplifying performance or an abnormal oscillation.

Further, in this circuit, the NPN transistor 3 and the PNP transistor 5 cancel each other's temperature inclination, thereby keeping the collector current of the transistor 3 substantially constant against temperature. This is because a rise in temperature invites a drop in the emitter voltage of the PNP transistor 5 or, conversely, a drop in temperature results in an emitter voltage rise. Also, a rise in temperature invites a drop in the base voltage of the NPN transistor 3 or, conversely, a drop in temperature results in a base voltage rise. Furthermore, the temperature inclinations of these voltages can be substantially equalized, with respect to each other, by appropriately selecting design factors in the transistor circuit.

Figure 2:
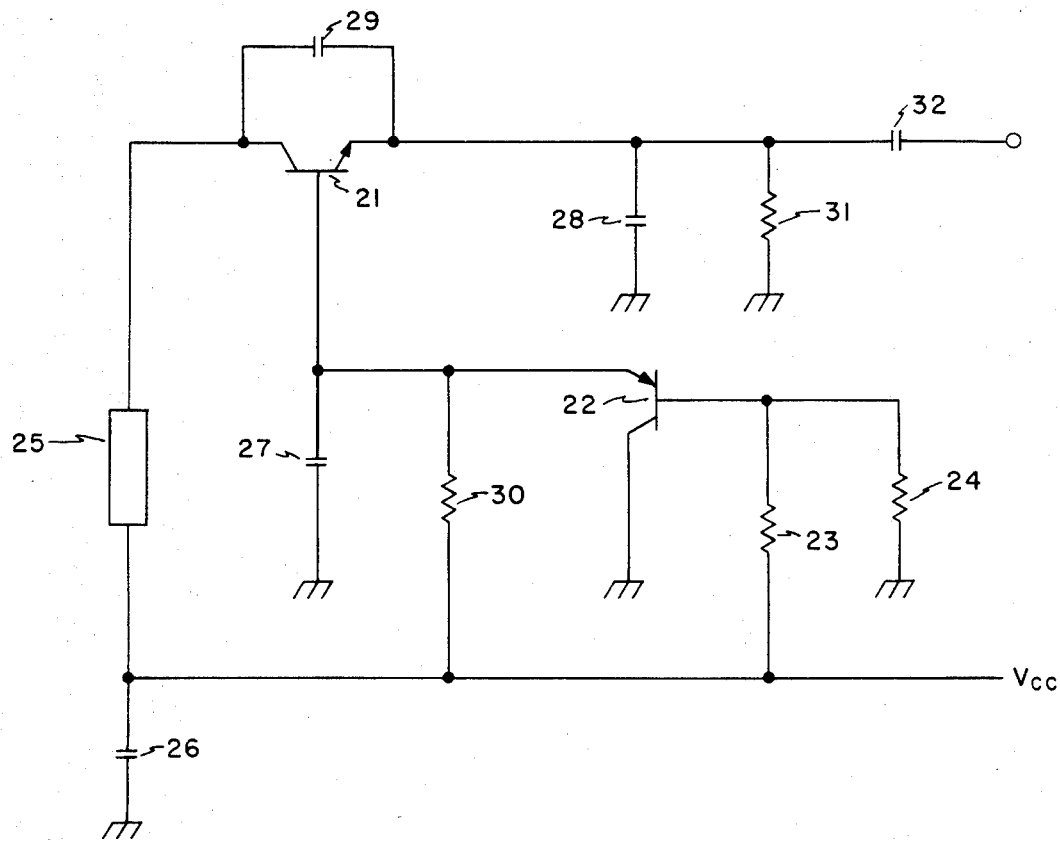
FIG. 2 illustrates a second embodiment of the invention, which is a transistor oscillator circuit.

A transistor circuit shown in FIG. 2 is a base-grounded oscillator circuit of Colpitts type, which comprises an NPN transistor 21, a resonator 25, and capacitors 28 and 29. A biassing voltage is supplied to the base of the transistor 21 from an emitter follower circuit comprising a PNP transistor 22 and resistors 23, 24 and 30. Similar to its counterpart in FIG. 1, the base of the PNP transistor 22 is connected to voltage dividing resistors 23 and 24, and its emitter is directly connected to the base of the NPN transistor 21. The collector of transistor 21 is connected to the resonator 25, for operating as an oscillator. Further in FIG. 2, reference numerals 26 and 27 identify bypass capacitors; 31, a resistor; 32, an output coupling capacitor; and 33, an output terminal.

In this circuitry, a high level oscillation signal is always fed between the base and the emitter of the transistor 21. However, the D.C. impedance of the base of the transistor 21 is lowered by the emitter follower type of PNP transistor 22. Therefore, there is only a small shift in the biassing point of the transistor 21, due to the high level oscillation signal. This obviates an abnormal oscillation and improves the stability in the oscillation frequency. A reduction in the collector current fluctuation of the NPN transistor 21, attributable to temperature variation, is also achieved as in the circuit illustrated in FIG. 1. The temperature-affected fluctuations of the oscillation output level and the oscillation frequency can also be kept small.

Figure 3:
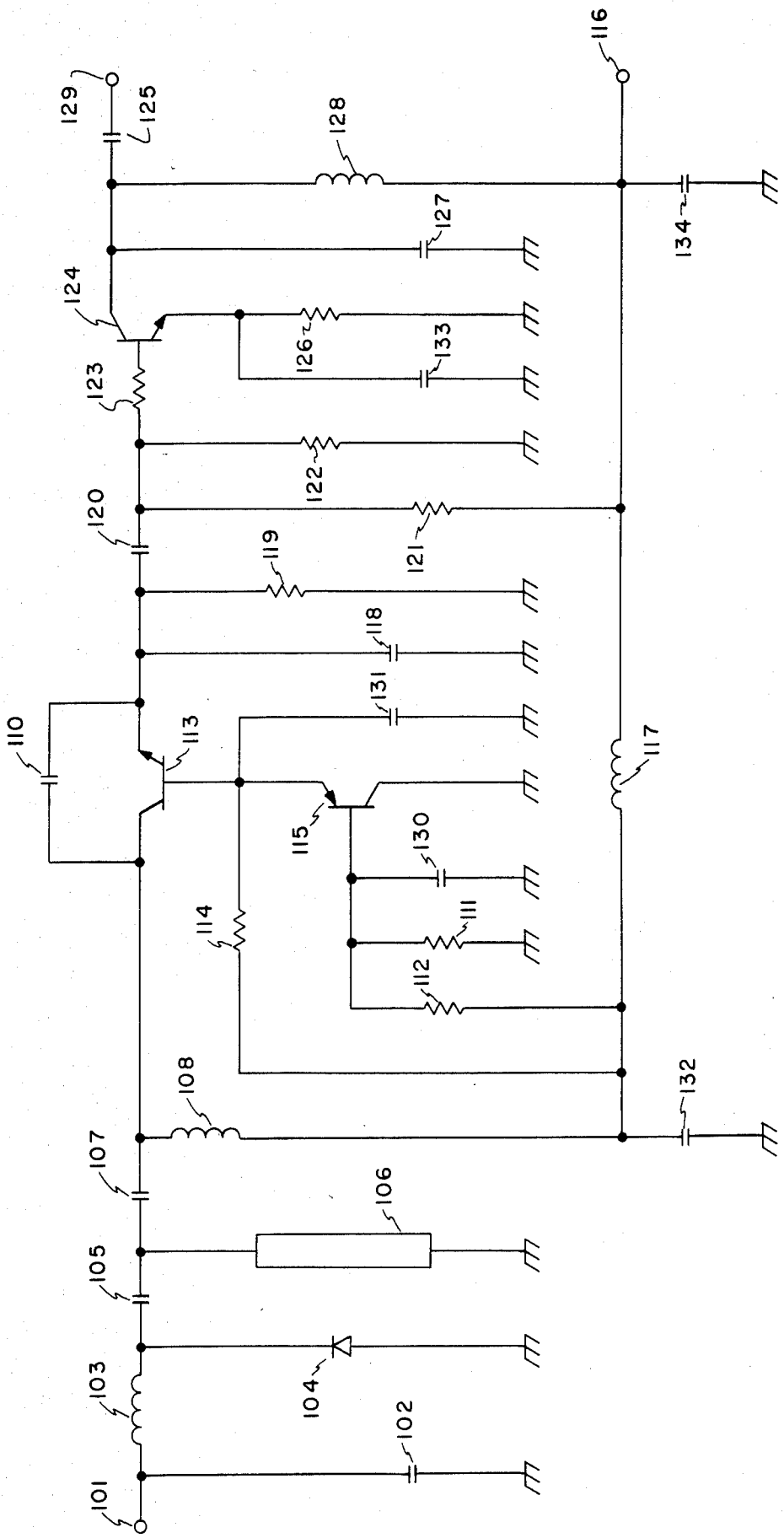
FIG. 3 illustrates a third embodiment of the invention, which is a transistor circuit forming a voltage-controlled oscillator.

A voltage controlled oscillator circuit is shown in FIG. 3. A transistor 113 has a base which is grounded through a bypass capacitor 131. The transistor 113, together with a coaxial oscillator 106 and capacitors 110 and 118, constitutes a Colpitts oscillator circuit. The impedance is inductive, looking at the side of a choke coil 108, from the collector of the transistor 113. This inductive impedance can be achieved by selecting the circuit constants of the choke coil 108, a capacitor 107, the coaxial oscillator 106, a capacitor 105 and a varactor 104. The capacitor 107 is used to increase the load impedance of the coaxial oscillator 106. The varactor 104 varies the oscillation frequency of the oscillator circuit, including the transistor 113. The variable frequency range is determined by the combination of transistor 113 and the capacitor 105.

A choke coil 103 feeds a D.C. voltage to the varactor 104 and, together with a bypass capacitor 102, prevents the oscillation signal from leaking back to input terminal 101.

By feeding a D.C. voltage to the input terminal 101, the oscillation frequency of the oscillator circuit, including the transistor 113, can be varied.

A resistor 119 is an emitter resistor, and the oscillation signal is supplied as output by a coupling capacitor 120.

A transistor 115 is used in an emitter follower circuit to give a base biassing voltage to the transistor 113. Resistors 111 and 112 are voltage dividing resistors for giving a base biassing voltage to the transistor 115, and a resistor 114 is an emitter resistor. This transistor 115 circuit operates in the same manner as the biasing circuit shown in FIG. 2.

A transistor 124 is a buffer amplifier for isolating the oscillator circuit from external circuits, and is given a biassing voltage by resistors 121 and 122. A resistor 123 is provided for stabilization of the buffer circuit, while a resistor 126 is an emitter resistor.

A tuning coil 128, together with capacitors 127 and 125, achieve impedance matching with external circuits, at the oscillation frequency. A terminal 129 is an output signal terminal, while a terminal 116 is a power supply terminal. Reference numerals 130 to 134 identify bypass capacitors, and numeral 117 identifies a choke coil.

As hitherto described, the present invention features the use of an emitter follower for supplying a base biassing voltage to a first transistor circuit. The emitter follower circuit includes another transistor having an inverse PN junction structure with respect to the first transistor. This feature makes it possible to significantly reduce the power consumption by voltage dividing resistors used in the emitter follower circuit. Further, there is the advantage of being able to suppressing the performance fluctuation of the transistor circuit, attributable to temperature variation, without deterioration of its performance.

What is claimed is:

1. A transistor amplification or oscillation circuit having first transistor means coupled to supply said A.C. amplification or oscillation, and biasing means comprising a voltage divider and a second transistor means for supplying a D.C. biasing voltage to the base of said first transistor means, said voltage divider including at least resistor means having an output terminal for providing said D.C. biasing voltage, said second transistor means being coupled in an emitter follower configuration, the base of said second transistor means being coupled to said output terminal of said voltage dividing resistor means for receiving said D.C. biasing voltage and the emitter of said second transistor means being D.C. coupled to the base of said first transistor means to supply said D.C. biasing voltage thereto.

2. A transistor circuit as claimed in claim 1, wherein said second transistor means has an inverse conductive junction structure with respect to a conductive junction of said first transistor means.

3. A transistor circuit as claimed in claim 2, wherein said first transistor means comprises an NPN transistor and said second transistor means comprises a PNP transistor.

4. A low power drain transistor circuit comprising first and second transistors of opposite conductive types, means for coupling said first transistor in a signal processing path, means for operating said second transistor in an emitter follower configuration circuit coupled to supply base bias to said first transistor, junctions of opposite conductivity types of said first and second transistors being coupled in a temperature compensating relationship.

5. The circuit of claim 4 in which said transistors are coupled in an amplifier configuration and said second transistor supplies said base bias via a choke coil.

6. The circuit of claim 5 in which said second transistors has a high $h_{fe}$ and a high resistance voltage divider for supplying bias to the base of said second transistor.

7. The circuit of claim 4 in which said transistors are coupled in an oscillator configuration and resonator means coupled in the collector-emitter circuit of said first transistor to feed a high level oscillation between the base and the emitter of said first transistor.

* * * * *